United States Patent [19]
Adachi et al.

[11] Patent Number: 5,670,457
[45] Date of Patent: Sep. 23, 1997

[54] OXIDE SUPERCONDUCTOR AND METHOD OF PRODUCING SAME

[75] Inventors: Seiji Adachi, Fujimi; Changqin Jin, Tokyo; Xiao-Jing Wu, Funabashi; Hisao Yamauchi, Nagareyama; Shoji Tanaka, Tokyo, all of Japan

[73] Assignees: International Superconductivity Technology Center; Matsushita Electric Industrial Co., Ltd., both of Japan

[21] Appl. No.: 356,640

[22] Filed: Dec. 15, 1994

[30] Foreign Application Priority Data

Dec. 24, 1993 [JP] Japan .................... 5-328547

[51] Int. Cl.$^6$ ............... H01B 12/00; H01L 39/12; C04B 35/01; C04B 35/03
[52] U.S. Cl. ............... 505/125; 505/482; 505/500; 505/776; 505/778; 752/521
[58] Field of Search ............... 505/125, 776, 505/778, 100, 482, 500; 252/521

[56] References Cited

U.S. PATENT DOCUMENTS

| | | | |
|---|---|---|---|
| 5,372,990 | 12/1994 | Nobumasa et al. | 505/776 |
| 5,374,611 | 12/1994 | Dabrowski et al. | 505/500 |
| 5,446,017 | 8/1995 | Sakurai et al. | 505/125 |
| 5,529,981 | 6/1996 | Holloway | 505/400 |

FOREIGN PATENT DOCUMENTS

| | | |
|---|---|---|
| 660424 | 6/1995 | European Pat. Off. |
| 05019 | 3/1994 | WIPO |

OTHER PUBLICATIONS

Adachi et al "High-pressure synthesis of superconducting Sr–Ca–Cu–O samples" Physica C, 208 10 Apr. 1993, pp. 226–230.

Li et al "Epitaxial Growth & Properties of $Ca_{1-x}Sr_xCuO_2$ Thin Films . . . " Jpn. J. Appl. Phys., vol. 31 (Mar. 1992) pp. L217–L220.

*Primary Examiner*—Paul Lieberman
*Assistant Examiner*—Mark Kopec
*Attorney, Agent, or Firm*—Lorusso & Loud

[57] ABSTRACT

An oxide superconductor composed of Cu, O and at least one of Ba, Sr and Ca and including alternately arranged at least one oxygen-deficient perovskite structure section and at least one infinite layer structure section, wherein the perovskite structure section consists of two first atomic layers and a second atomic layer sandwiched between the first layers, and wherein the infinite layer structure section consists of alternately arranged, third and fourth atomic layers. Each of the first layers consists of O and an element $M^1$ selected from Ba, Sr and Ca and has an atomic ratio $O/M^1$ of 1 or less, while the second layer consists of O and Cu and has an atomic ratio O/Cu of 2 or less. Each of the third layers consists of O and Cu and has an atomic ratio O/Cu of 2, while each of the fourth layers consists of an element $M^2$ selected from Ba, Sr and Ca. A superconductor having a superconducting critical temperature of over 100 K. may be produced by heat treatment at 800°–1,200°C. under a super-high pressure of 20,000–80,000 atm.

6 Claims, 5 Drawing Sheets

OXIDE SUPERCONDUCTOR AND METHOD OF PRODUCING SAME

This invention relates to an oxide superconductor having a superconducting transition temperature Tc of 100 K. or more and a method of producing same.

Because of their peculiar characteristics such as zero resistivity, perfect diamagnetism and Josephson effect, superconductors are anticipated for utilization in various applications such as electric power transmission, electric generators, nuclear fusion plasma containment, magnetic levitation trains, magnetic shield and high speed computers.

An oxide superconductor $(La_{1-x}Ba_x)_2CuO_4$ having Tc of about 30 K. was found by Bendonorz and Muller in 1986. Since then, various superconductors such as $YBa_2Cu_3O_x$ (Tc=90 K.), Bi—Sr—Ca—Cu—O (Tc=110 K.), Tl—Ba—Ca—Cu—O (Tc=125 K.) and Hg—Ba—Ca—Cu (Tc=135 K.) have been reported. From the standpoint of industrial application, however, these superconductors have a drawback that the raw material is not available at low costs or toxic to human bodies.

Recently, a new superconductor $(Sr_{1-x}Ca_x)_{1-y}CuO_{2+z}$ having Tc of 110 K. was found (M. Azuma et al, Nature, 356, 775 (1992)). This superconductor has a simple crystal structure called "infinite-layer" structure constituted from $Cu$—$O_2$ and (Sr/Ca) layers. A (Sr, Ca)—Cu—O superconductor called 02(n-1)n and having alternately arranged infinite structure sections and rock salt structure sections has also been reported by Adachi et al (Physica C, 212 164 (1993)). There is an increasing demand for a novel oxide superconductor having a superconductive transition temperature Tc of 100 K. or more and obtainable from easily available raw materials which are not harmful to human bodies.

In accordance with one aspect of the present invention there is provided an oxide superconductor composed of Cu, O and at least one alkaline earth metal selected from the group consisting of Ba, Sr and Ca and comprising alternately arranged at least one oxygen-deficient perovskite structure section and at least one infinite layer structure section, said perovskite structure section consisting of two first atomic layers each consisting of O and an element $M^1$ which is at least one alkaline earth metal selected from the group consisting of Ba, Sr and Ca and each having an atomic ratio O/$M^1$ of 1 or less, and a second atomic layer sandwiched between said first atomic layers, said second atomic layer consisting of O and Cu and having an atomic ratio O/Cu of 2 or less, said infinite layer structure section consisting of j-number and k-number of third and fourth atomic layers, respectively, wherein j is an integer of 1 or more and k is an integer of 0 or more, said third and fourth atomic layers being alternately arranged when (j+k) is 2 more, each of said j-number third atomic layers consisting of O and Cu and having an atomic ratio O/Cu of 2, and each of said k-number fourth atomic layers consisting of an element $M^2$ which is at least one alkaline earth metal selected from the group consisting of Ba, Sr and Ca.

In another aspect, the present invention provides a method of producing an oxide superconductor composed of Ba, Ca, Cu and O, comprising heating a composition containing Ba, Ca, Cu and O at a temperature of 800°–1,200° C. and a pressure of 20,000 to 80,000 atm.

The present invention will be described in more detail below with reference to the accompanying drawings, in which.

Figure 1:
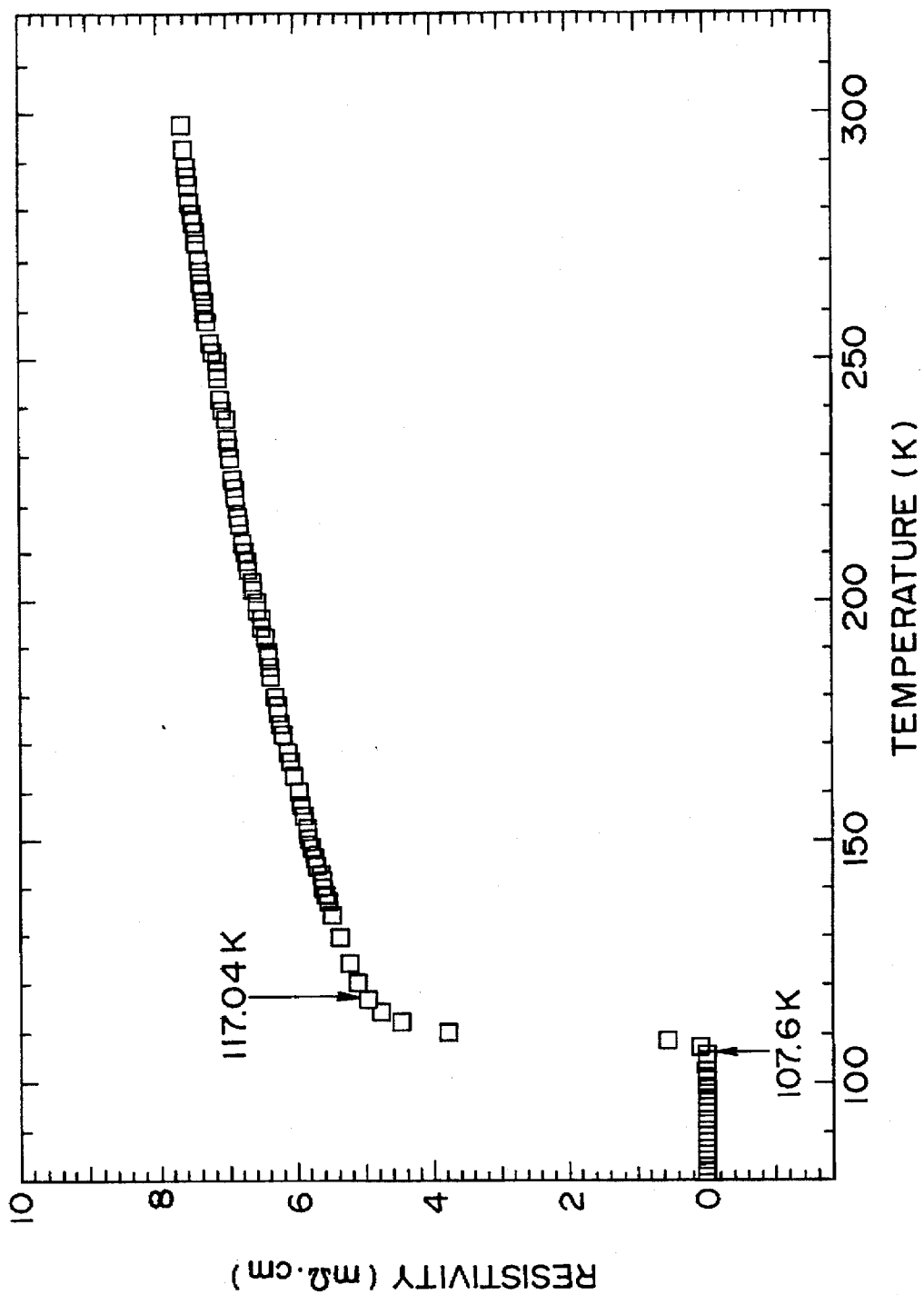
FIG. 1 is a graph showing a relationship between temperature and resistivity of a superconductor sample of the present invention.
Figure 3:
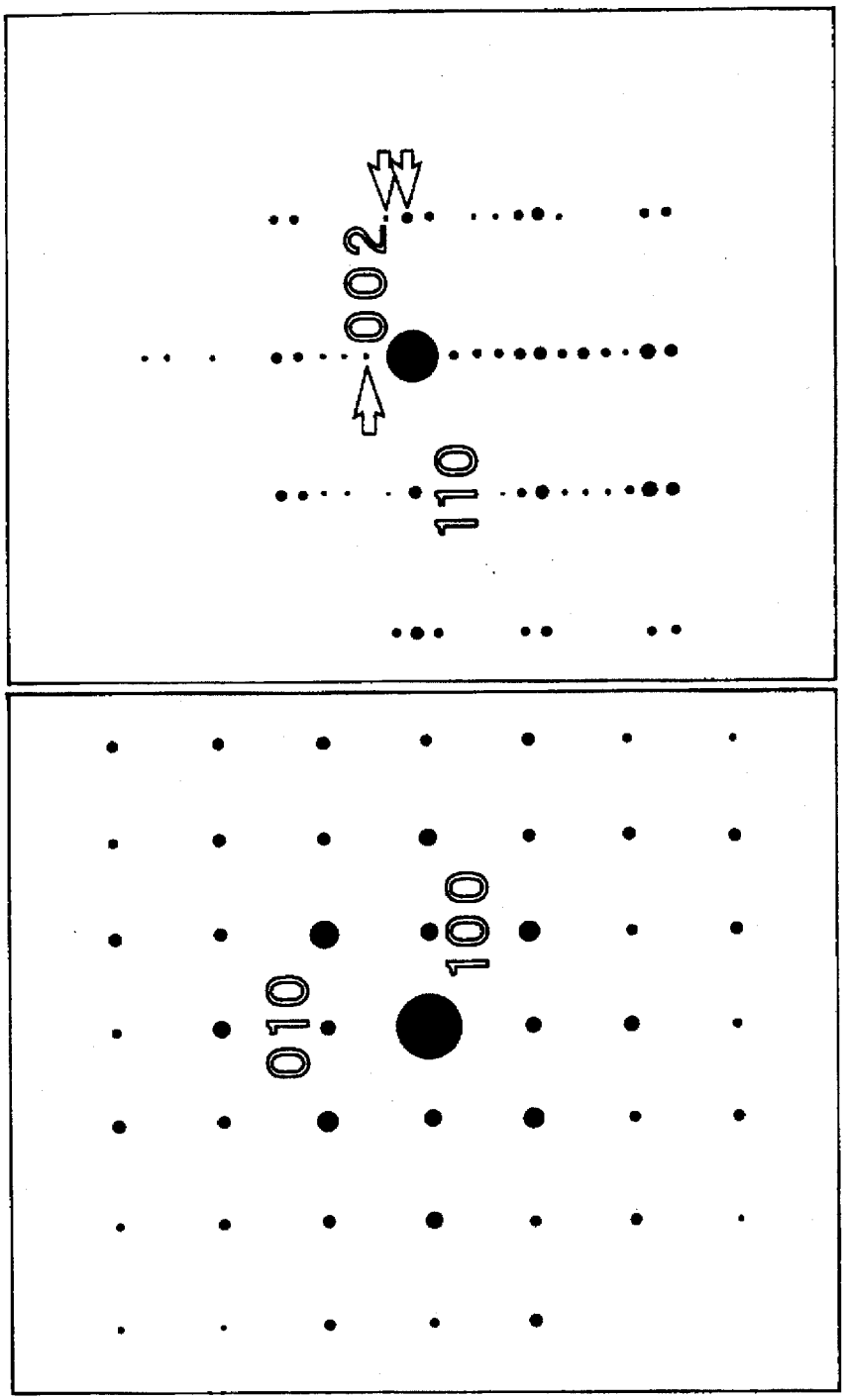
Figure 4:
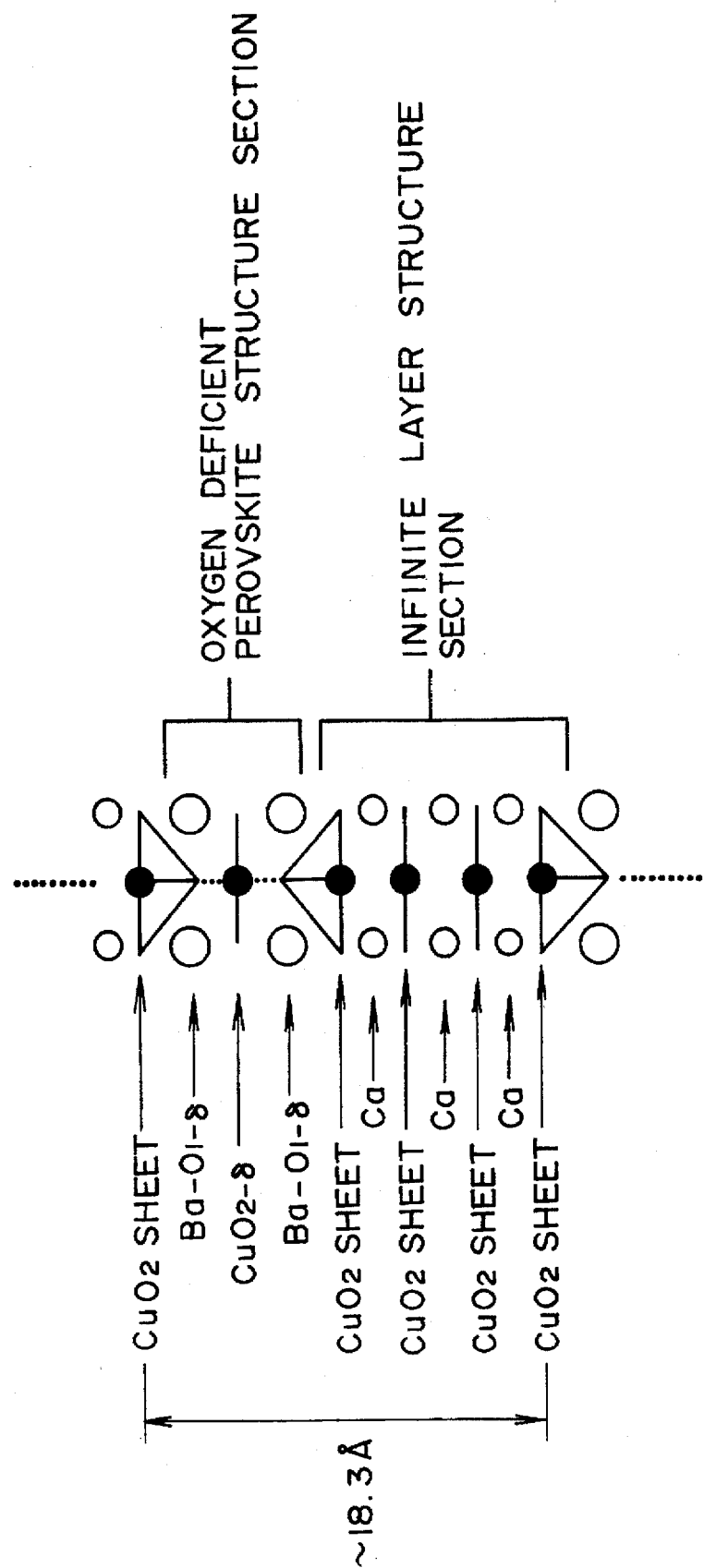
Figure 5:
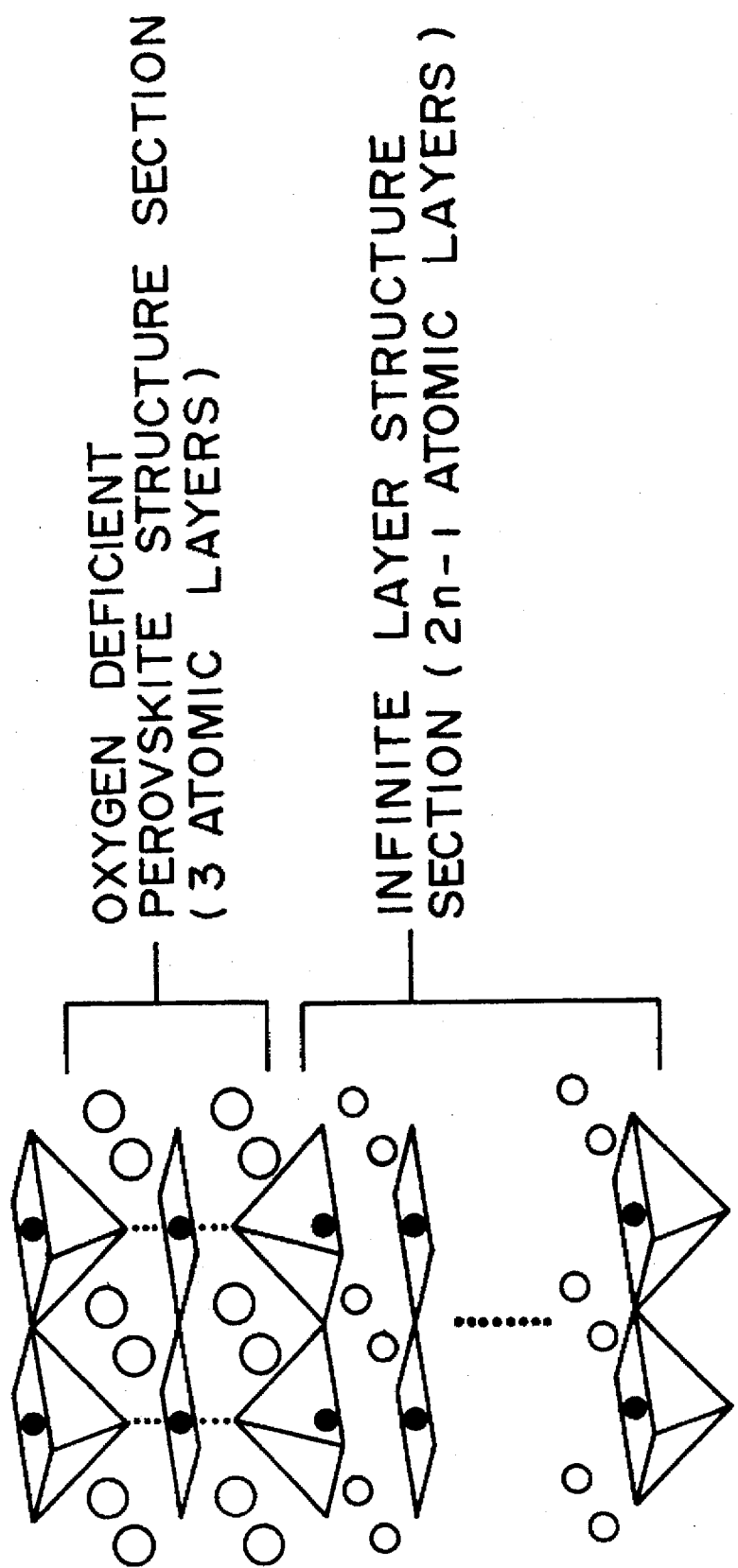

FIGS. 3(a) and 3(b) are electron beam diffraction patterns of the sample of FIG. 1;

FIG. 4 is a schematic illustration explanatory of the crystal structure of the sample of FIG. 1; and FIG. 5 is an illustration explanatory of the general crystal structure of the superconductor of the present invention.

The following examples will illustrate the present invention.

EXAMPLE 1

Powders of $BaO_2$, CaO and CuO each having a purity of 99.9% or more were blended in amounts providing a molar ratio Ba:Ca:Cu of 2:3:4. The mixture was calcined at 920° C. for 24 hours in an oxygen stream, and the calcined product was pulverized. Such calcination and pulverization steps were repeated several times. The resulting calcined powder was charged in a gold capsule and heat-treated at 950° C. and 5 GPa for 1 hour using a super-high pressure generator of a hexagonal cubic anvil type. The gold capsule was placed in a graphite sleeve heater through a thin BN layer. While applying a pressure, an electric current was fed to the graphite for performing the heat treatment to obtain a sample.

FIG. 1 shows temperature dependency of the electrical resistivity of the thus prepared sample. As the temperature decreases, the resistivity decreases in a pattern similar to a metal and abruptly decreases at about 117 K. At 107.6 K., the resistivity becomes zero.

Figure 2:
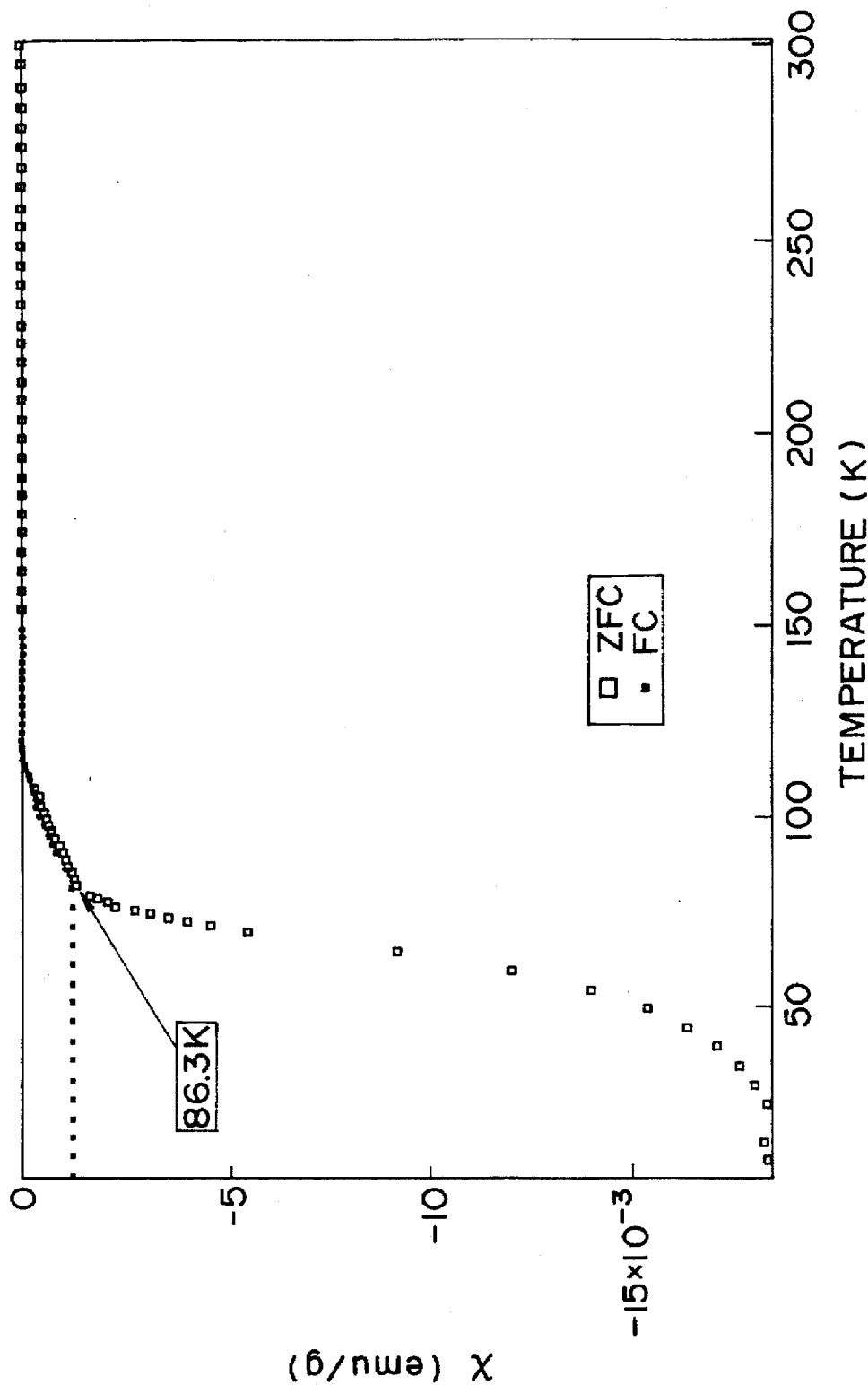
FIG. 2 is a graph showing temperature-magnetic susceptibility characteristics of the sample of FIG. 1.

FIG. 2 is a graph showing temperature-magnetic susceptibility characteristics of the above sample. The measurement was performed in two different methods; i.e. a zero field cooling (ZFC) method in which the sample cooled to 4.2 K. is gradually heated while applying a magnetic field of 10 Oe, and a field cooling (FC) method in which the sample is gradually cooled while applying a magnetic field. A signal showing diamagnetism appears at a temperature of below 116 K. The superconductive volume fraction at a temperature of 5 K. estimated from the data of the FC method is over 10%. These data suggest that the sample is a bulk superconductor.

FIGS. 3(a) and 3(b) are electron beam diffraction patterns of the novel superconducting phase contained in the sample. FIG. 3(a) is a pattern along the [001] direction, from which it is seen that the unit cell of the crystal structure is a tetragonal system having an a-axis length of 3.88 Å. From FIG. 3(b), which is a pattern along the [110] direction, it is seen that the c-axis length (distance between the two parallel white arrows) is 18.3 Å. When the axis of the incident electron beam is [120] direction, there is observed a 210 spot. This suggests that the unit lattice is not body-centered tetragonal but presents a simple tetragonal space group. In view of the fact that the sample is a superconductor having a high Tc and is composed of Ba, Ca, Cu and O, the sample is considered to have a structure which contains two-dimensionally extending $CuO_2$ sheets and in which "charge donating layer" blocks and infinite layer structure blocks are alternately stacked.

The number of the atomic layers in a "charge donating layer" block is generally 2–4. In the only case of a system containing Pb, the number can be 5. Each of the outer two layers in the direction of the c-axis is always composed of M and O with the intermediate layer or layers being composed of a metal and O. Since the novel superconducting phase of the present invention has a simple tetragonal crystal

3 system, the number of the atomic layers is three in the "charge donating layer" section.

FIG. 4 is an illustration of the general crystal structure of the superconductor of the present invention as seen in the [100] direction. In FIG. 4, the black circle designates a copper atom, the white large circle designates Ba, the white small circle designates Ca, and each of the corners or apices is a position at which an oxygen atom is located. The oxygen cites of the "charge donating layer" section are partially deficient so that the average valence of the copper is in the range of 2.1–2.3 required for superconductivity. The powder X-ray diffraction pattern of the sample indicates that the above crystal phase is the main phase thereof. Thus, the superconductivity of the sample is attributed to the above-described novel phase.

EXAMPLE 2

A number of samples were produced in the same manner as described in Example 1 except that the reaction conditions and the molar ratios of the reactants were changed as summarized in Table 1 below. The superconducting critical temperature (Tc: a temperature at which the electrical resistivity begins abruptly deceasing) and the superconducting volume fraction (at 5 K.) of the samples are also shown in Table 1.

| Molar Ratio (Ba:Ca:Cu) | Temperature (°C.) | Time (hour) | Pressure (GPa) | Tc (K) | Volume Fraction (%) |
|---|---|---|---|---|---|
| 2:3:4 | 950 | 1 | 5 | 117 | 12 |
| 2:3:4 | 950 | 3 | 5 | 117 | 17 |
| 2:3:4 | 950 | 0.5 | 5 | 111 | 6 |
| 2:3:4 | 1,000 | 1 | 5 | 112 | 10 |
| 2:3:4 | 1,100 | 1 | 5 | 110 | 9 |
| 2:3:4 | 1,200 | 1 | 6 | 112 | 8 |
| 2:3:4 | 1,300 | 1 | 5 | — | — |
| 2:3:4 | 700 | 1 | 5 | — | — |
| 2:3:4 | 800 | 1 | 5 | 112 | 5 |
| 2:3:4 | 900 | 1 | 5 | 112 | 10 |
| 2:3:4 | 950 | 1 | 5 | 116 | 12 |
| 2:3:4 | 950 | 1 | 2 | 117 | 15 |
| 2:3:4 | 950 | 1 | 3 | 115 | 14 |
| 2:1:3 | 950 | 1 | 5 | 101 | 15 |
| 2:2:4 | 950 | 1 | 5 | 110 | 14 |
| 2:3:5 | 950 | 1 | 5 | 117 | 20 |
| 2:4:6 | 950 | 1 | 5 | 111 | 10 |

As will be appreciated from the results shown in Table 1, high Tc superconductors are obtained by the heat treatment at 800°–1,200° C. While similar results are considered to be obtainable by heat treatment at a pressure of more than 8 GPa, the use of such a high pressure requires special apparatuses and is not advantageous from the standpoint of economy.

By varying the molar ratio of the raw materials, superconductors having Tc higher than 100 K. were obtained. It was confirmed that these new superconducting phases have a c-axis length of 18.3 Å±3.2 Å and an a-axis length of 3.87 Å±0.3 Å. The length of 3.2 Å corresponds to the c-axis length of one unit cell of the infinite layer structure section. Therefore, the novel superconductors include homologous series having various numbers (2n–1 where n is an integer of 1 or more) of the atomic layers in the infinite layer structure section.

EXAMPLE 3

As shown in Example 2, when a raw material charge having a molar ratio of Ba:Ca:Cu of 2:3:5 was treated at 950° C. and 5 GPa for 1 hour, the resulting superconductor showed Tc (on set) of 117 K. and a superconducting volume fraction of 20%. This experiment was performed in the same manner as above except that a part of Ba was substituted by Sr. Good superconductors were found to be obtainable by substitution of Sr for up to about 70% of Ba. In the case where Ba:Sr:Ca:Cu was 0.6:1.4:3:5, the resulting superconductor showed Tc (on set) of 110 K. and a superconductive volume fraction of 12%. When more than 70% of Ba was substituted by Sr, the infinite layer and O2(n–1)n with n=2, 3 and 4 structures were found to be stabilized. The superconductive volume fractions for these samples were very small.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. An oxide superconductor composed of Cu, O and at least one alkaline earth metal selected from the group consisting of Ba, Sr and Ca and consisting of alternately arranged at least one oxygen-deficient perovskite structure section and at least one infinite layer structure section, said perovskite structure section consisting of two first atomic layers each consisting of O and an element $M^1$ which is at least one alkaline earth metal selected from the group consisting of Ba, Sr and Ca and each having an atomic ratio O/$M^1$ of 1 or less, wherein $M^1$ in each of said two first layers is the same, and a second atomic layer sandwiched between said first atomic layers, said second atomic layer consisting of O and Cu and having an atomic ratio O/Cu of 2 or less, said infinite layer structure section consisting of j-number and k-number of third and fourth atomic layers, respectively, wherein j is an integer of 1 or more and k is equal to j–1, said third and fourth atomic layers being alternately arranged when is 2 or more, each of said j-number third atomic layers consisting of O and Cu and having an atomic ratio O/Cu of 2, and each of said k-number fourth atomic layers consisting of an element $M^2$ which is at least one alkaline earth metal selected from the group consisting of Ba, Sr and Ca, wherein $M^2$ in each of said fourth atomic layers is the same.

2. A superconductor as claimed in claim 1, and composed of Cu, Ba, Ca and O.

3. A superconductor as claimed in claim 1, and composed of Cu, Ba, Ca, Sr and O.

4. A superconductor as claimed in claim 1, wherein said perovskite structure section has a composition comprising Ba, Cu and O and said infinite structure section has a composition comprising Ca, Cu and O.

5. A superconductor as claimed in claim 4, wherein said composition of said perovskite structure section additionally contains Sr in an amount up to 70 mole % based on total of Sr and Ba.

6. A method of producing the oxide superconductor of claim 1, comprising heating a composition containing Ba, Ca, Cu and O at a temperature of 800–1,200°C. and a pressure of 20,000 to 80,000 atm.

* * * * *

UNITED STATES PATENT AND TRADEMARK OFFICE
CERTIFICATE OF CORRECTION

PATENT NO. : 5,670,457
DATED : September 23, 1997
INVENTOR(S) : ADACHI et al

It is certified that error appears in the above-indentified patent and that said Letters Patent is hereby corrected as shown below:

Col. 4, line 42, after "when" insert --j--; and line 65, "arm" should read --atm--.

Signed and Sealed this

First Day of September, 1998

Attest:

BRUCE LEHMAN

*Attesting Officer*      *Commissioner of Patents and Trademarks*